(12) United States Patent
Treuz et al.

(10) Patent No.: US 10,684,309 B2
(45) Date of Patent: Jun. 16, 2020

(54) CONTACT HEAD FOR AN ELECTRICAL TESTING DEVICE, TESTING DEVICE

(71) Applicant: FEINMETALL GMBH, Herrenberg (DE)

(72) Inventors: Stefan Treuz, Bodelshausen (DE); Denis Tabakow, Böblingen (DE); Berislav Kopilas, Althengstett (DE)

(73) Assignee: FEINMETALL GMBH, Herrenberg (DE)

( * ) Notice: Subject to any disclaimer, the term of this patent is extended or adjusted under 35 U.S.C. 154(b) by 79 days.

(21) Appl. No.: 15/992,915

(22) Filed: May 30, 2018

(65) Prior Publication Data
US 2018/0348257 A1 Dec. 6, 2018

(30) Foreign Application Priority Data
May 31, 2017 (DE) .................. 10 2017 209 254

(51) Int. Cl.
*G01R 1/067* (2006.01)
*G01R 31/28* (2006.01)
*G01R 1/44* (2006.01)

(52) U.S. Cl.
CPC .......... *G01R 1/06738* (2013.01); *G01R 1/44* (2013.01); *G01R 31/2831* (2013.01); *G01R 31/2886* (2013.01)

(58) Field of Classification Search
CPC .. G01R 1/06738; G01R 1/44; G01R 31/2831; G01R 31/2886; G01R 31/00; G01R 1/0416

(Continued)

(56) References Cited

U.S. PATENT DOCUMENTS

| 5,430,292 A | * | 7/1995 | Honjo | .................. G03F 1/86 |
| | | | | 250/310 |
| 8,222,912 B2 | * | 7/2012 | Dang | .................. G01R 1/0675 |
| | | | | 324/750.15 |

(Continued)

FOREIGN PATENT DOCUMENTS

| DE | 102004023987 A1 | 12/2005 |
| DE | 102006054734 A1 | 6/2007 |

OTHER PUBLICATIONS

European Search Report for related application EP 18174979.7, EPO, Munich, dated Oct. 23, 2018.

*Primary Examiner* — Giovanni Astacio-Oquendo
(74) *Attorney, Agent, or Firm* — Stephen T. Olson; Harness, Dickey & Pierce, P.L.C.

(57) ABSTRACT

A contact head (6) for an electrical test device (1) for electrically testing substrates, which have electrical contact points, with at least two guide plates (13, 14) that are arranged to each other by a spacer (15) and each have guide openings (16) essentially aligned with each other for receiving pin-shaped contact elements (8) and are oriented to each other by a centering device (20), wherein the centering device (20) has four centering pins (19), which are displaceably mounted in a slot (23), extending toward a center (Z) of the contact head (6), at least of one of the guide plates (13, 14), and wherein the centering pins (19) are each held in a centering opening (18) of the spacer (15). It is provided that the centering openings (18) each have only one guide surface (21) oriented at least essentially parallel to a radial axis (R)—in relation to the center (Z).

10 Claims, 2 Drawing Sheets

(58) Field of Classification Search
USPC .................................. 324/755.01, 537, 500
See application file for complete search history.

(56) References Cited

U.S. PATENT DOCUMENTS

| | | | | |
|---|---|---|---|---|
| 2006/0076503 | A1* | 4/2006 | Tsao | H01J 37/228 |
| | | | | 250/396 R |
| 2006/0273263 | A1* | 12/2006 | Raymond | G01B 11/0616 |
| | | | | 250/492.2 |
| 2007/0128076 | A1 | 6/2007 | Bohm | |
| 2013/0342232 | A1* | 12/2013 | Park | G01R 1/07342 |
| | | | | 324/750.16 |
| 2018/0024166 | A1* | 1/2018 | Acconcia | G01R 1/06733 |
| | | | | 324/750.25 |

* cited by examiner

CONTACT HEAD FOR AN ELECTRICAL TESTING DEVICE, TESTING DEVICE

CROSS REFERENCE TO RELATED APPLICATION

This application claims priority to German Patent Application DE 10 2017 209 254.8, filed on May 31, 2017, the entire disclosure of which is incorporated by reference herein.

FIELD

The invention relates to a contact head for an electrical test device for the electrical testing of substrates, which have electrical contact points, particularly electric conductors and/or electric/electronic components, having at least two guide plates, which are arranged parallel to each other by means of a spacer and each of which have multiple guide openings at least essentially aligning with each other to receive pin-shaped contact elements and which are oriented to each other by means of a centering device, wherein the centering device has four centering pins, which are each displaceably positioned in a slot, extending toward the center of the contact head, in at least one of the guide plates, and wherein the centering pins are each held in a centering opening of the spacer.

Furthermore, the invention relates to an electrical test device for electrically testing substrates, which have electrical conductors and/or electric/electronic components.

BACKGROUND

Electrical test devices of the aforementioned type are used to electrically contact a sample or the substrate to the electric conductors and/or components to check the operability of the substrate. The test device creates electrical connections to the substrate, on the one hand by contacting the substrate or the electrical conductors or electrical contact points of the substrate, and on the other by providing electrical contacts, which are connected to a test system, so that the test system can supply the sample with electrical signals via the test device to perform, for example, resistance measurements, current and voltage measurements or similar for a function check. Because the substrates to be tested, such as wafers, circuit boards, or solar cells, often involve extremely small components or components with a high density of electrical contact points, contact elements having small dimensions are necessary to achieve a high degree of sampling and contacting respectively on a small space. Conventionally, the guide openings in the guide plates are thereby arranged corresponding to the electrical contact points on the test sample so that the contact elements are positioned correspondingly.

Because various room and/or testing temperatures may exist when performing the test, it is necessary that thermally-caused length changes of the test device do not result in the positioning of the contact elements deviating in relation to the electrical contact points on the sample or the substrate, by means of which a test could no longer be performed successfully. It is therefore known to provide centering devices, which permit a temperature expansion leeway in the test device in such a manner that an offset of the contact elements due to temperature-contingent quantity changes are minimal.

In this regard, patent application DE 10 2004 023 987 A1 for example reveals an electrical test device with a centering device, which permits only a radial, in other words leading towards or away from the center, temperature margin in relation to the center of the test device or the contact head, in other words the center in a plane parallel to the guide plates. By the radial orientation toward the center, one achieves an overall minimum shift in case of temperature-contingent quantity changes because the length changes in the respective plate cannot have a cumulative effect over the entire width of the respective guide plate.

To do so, the centering device has multiple centering pins, which are attached to the spacer in centering openings and are inserted in the slots in the guide plates, wherein the longitudinal direction of the slots is oriented radially toward the center. To ensure proper operation, high tolerance requirements are thereby to be fulfilled by the centering pins, slots, and centering openings. The centering openings are thereby designed as boreholes, in other words with a circular contour, which is why high requirements are placed on the manufacturing tolerances to permanently ensure a functioning centering operation.

SUMMARY

The object of the invention is to create a contact head and a test device respectively of the type mentioned above, which permit an advantageous radial temperature expansion margin, but can be cost-effectively manufactured and permit larger production tolerances.

The underlying object of the invention is solved by a contact head with the features of claim 1 and a test device with the features of claim 10 respectively. The contact head according to the invention has the advantage that the centering pins are optimally held or positioned in relation to their function, so that on the one hand the radial temperature expansion margin is assured in any case, and that on the other the contact head can be manufactured cost-effectively and with low tolerance requirements. According to the invention, this is achieved by the fact that the centering openings each have only one guide surface oriented at least parallel to the radial direction. In contrast to the centering openings already known from prior art, it is thus provided according to the invention that the centering openings each have one, and specifically one single guide surface, which is oriented at least parallel to a radial axis, which runs through a center of the contact head. Because in this way each of the four centering openings of the spacer, which in particular is also designed in a plate-like manner, only has one such guide surface oriented at least parallel to the radial direction, a clear arrangement of the centering pins in the centering openings is collectively assured, which permits temperature-contingent size changes without thereby losing the centering function. As a result, when manufacturing the guide plates in particular, only the tolerances of the one guide surface in each case of each centering opening must be precisely complied with, while the remaining contour of the respective centering openings can be machined in a less precise and thus cost-effective manner. Given a temperature change, the centering pins rigidly held in the centering openings then slide in the respective slot to compensate for the temperature-contingent size changes.

According to a preferred development of the invention, it is provided that the guide surfaces each run along the radial axis. In this way, the guide surfaces are not oriented parallel to the guide surfaces but run exactly along the radial axis. One thereby achieves that the centering pins are not guided with their center and their central axis respectively along the radial axis, but with their outer circumference. As a result, a clear guiding of the centering pins or guide plates on the centering pins is reliably assured, wherein a redundancy of the guide is avoided by only one such guide surface being constructed on the respective centering opening.

Preferably, the centering openings each have a supplementary guide surface oriented at least essentially perpendicular to the guide surface. The guide surface and the supplementary guide surface thereby form a type of guide prism or triangle, by means of which the respective centering pin can be reliably guided and oriented. While the guide surfaces each preferably run exactly along the radial axis, the arrangement of the supplementary guide surfaces is not so important and can be provided with larger tolerances, so that a reliable arranging or orienting of the guide plates is ensured at any time, even at variable temperatures. Due to their perpendicular orientation, the supplementary guide surfaces limit the maximum displacement of the guide plates relative to the centering pins, so that incorrect installation can be easily prevented for example.

Furthermore, it is preferably provided that the supplementary guide surfaces are each constructed at a radially inward end of the respective guide surface. Ultimately, the supplementary guide surfaces thereby lie between the centering pins and the center of the respective guide plate or contact head. Supplementary guide surfaces thereby expediently lie so far radially inward that an expected temperature margin can be reliably compensated for or balanced by the guide plates, without mechanical tension forming in the guide plate. Because the supplementary guide plates do not have a joining function, their design and tolerance accuracy are of minor importance.

It is furthermore provided that the centering openings are formed in a square, rectangular, triangular or, except for the guide surface and supplementary guide surface, in a circular manner. Ultimately, the respective centering opening can thereby be manufactured in a simple, quick, and cost-effective manner. For example, it is provided that the respective centering opening is initially begun by a borehole and completed by an eroding, particularly wire-eroding, of the guide surface and if applicable the supplementary guide surface, so that the respective centering opening is designed in a circular manner to the guide surface and supplementary guide surface. A circular section of the centering opening remains, which connects the guide surface and supplementary guide surface to each other. It is also conceivable to construct the centering opening up to the guide surface and, if applicable, the supplementary guide surface in an oval shape. Alternatively, the respective centering opening is constructed to be square, rectangular or triangular, wherein then the guide surface is formed by a side surface and the supplementary guide surface is formed by a side surface connecting to said guide surface.

According to a preferred development of the invention, it is provided that there are exactly four centering pins. This results in an advantageous and clear guiding and mounting of the guide plates and centering pins respectively, which ensures a clear orientation and heat compensation movement.

In particular, it is provided that in each case, two of the centering openings are arranged diametrically opposite each other in relation to the center, so that the guide surfaces lie on a common straight line, which runs through the center. A clear arrangement and orientation of the guide plates and guide openings arranged/constructed in the guide plates for the contact elements to each other is ensured in a particularly reliable manner. The advantageous orientation and arrangement of the guide surfaces also reduces or equalizes a tolerance requirement in manufacturing the respective centering pin.

Furthermore, it is preferably provided that the centering pins are held in a friction-locking and form-locking manner in the respective centering opening by a radial or lateral setscrew, particularly by at least one grub screw, which radially contacts the respective centering pin with a pressure force and in particular presses against the guide surface and/or the respective supplementary guide surface. This provides for a simple installation and a clear mounting of the centering pins in the centering openings.

Preferably, the centering pins are also displaceably mounted in slots of both guide plates, so that the advantageous centering function or temperature margin function benefits both guide plates.

According to a first embodiment, the centering pins may each be formed as a single piece, so that they extend from the one guide plate through the entire spacer to the other guide plate and all the way through it. Alternatively, it may be provided that the centering pins are formed in a two-part manner, wherein a first pin section aligns into the slot of the one guide plate and the second pin section, which aligns with the first pin section in particular, protrudes into a slot of the other guide plate to ensure centering of the guide plates to each other. In each case, two of the pin sections may thereby be held in the same centering opening by a set screw each, or in two different centering openings.

Furthermore, it is preferably provided that the guide plates are manufactured out of a ceramic material and the spacer is manufactured out of metal. This results in a variable temperature expansion behavior of the guide plates and spacers to each other, which however is reliably compensated for by the advantageous centering device or influenced in such a manner that the arrangement of the contact elements, which are formed as contact pins or contact needles, is ensured as described earlier.

The electrical test device with the features of claim 10 is characterized by the contact head according to the invention, which hereby results in the already mentioned advantages.

Additional advantages and preferred features and feature combinations result particularly from what was described earlier as well as the claims. The invention is explained in greater detail below by means of the drawings.

DETAILED DESCRIPTION

Figure 1:
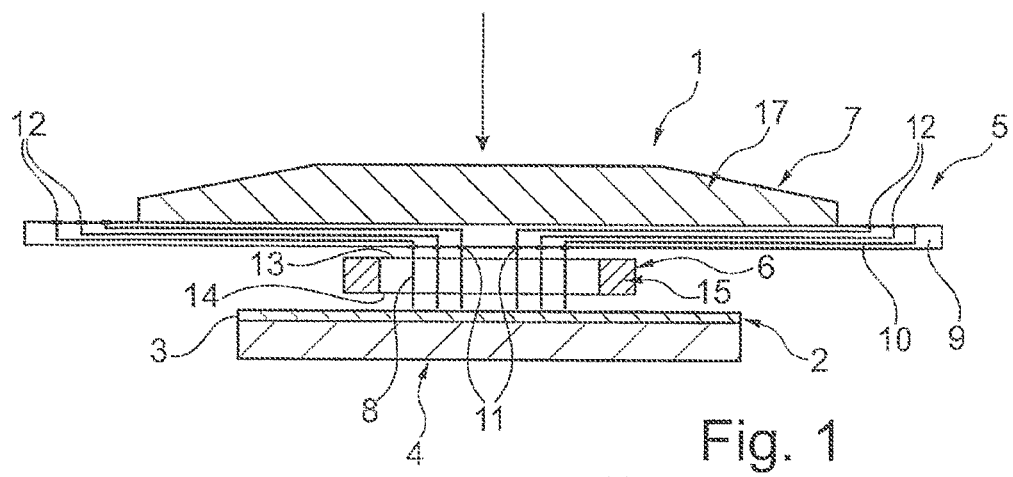
FIG. 1 shows an electrical test device in a simplified view.

FIG. 1 depicts a schematic view of the cross-section of an electrical test device, which is designed to electrically contact a substrate 2, which has a plurality of electrical contact points. Substrate 2 is constructed for example as a wafer 3, circuit board or solar cell, and can be placed on a support 4, particularly of test device 1. Support 4, also referred to as a chuck, is designed in such a manner that it can be cooled or heated, wherein a cooling device and/or a heating device is integrated in or arranged on support 4. While conducting a test, it is hereby possible to subject substrate 2 to various temperatures to enable one to also determine the functioning of substrate 2 at various temperatures. For contacting substrate 2, test device 1 has a so-called test card 5, which has a contact head 6 as well as a connection device 7 for conducting the test. Contact head 6 carries a plurality of pin-shaped contact elements 8, which are mounted in a longitudinally displaceable manner and parallel to each other. Contact elements 8 each have a first end facing support 4 and substrate 2 respectively. The other end of the contact element 8 is in each case allocated to connection device 7.

In this case, connection device 7 is designed as a multi-layer guide plate 9, which has a plurality of electrically conductive paths. On their respective end allocated to contact head 6, the conductive paths have contact surfaces 11, which can be touch-contacted by contact elements 8. On their radially outward ends pointing away from contact head 6, conductive paths 10 each have a connection surface 12, which can be connected to a test system not depicted here by means of non-depicted cable connections.

To that extent, connection device 7 forms a conversion device, which converts a very narrow gap of the very small contact surfaces 11 over conductive paths 10 into larger gaps of connection surfaces 13 to each other, so that contact surfaces 11 can be electrically contacted more simply, and wherein the arrangement of contact surfaces 11 corresponds to the arrangement of pin-shaped contact elements 8 on a dense grid. The size of contact surfaces 11 is thereby correspondingly selected in such a manner that reliable touch-contacting by contact elements 8 can occur, while the size of connection surfaces 12 is selected in such a manner that a simple electrical contacting 11, for example by means of connection cables and soldering joints, is assured.

In testing substrate 2, connection device 7 moves toward support 4 and/or support 4 moves towards connection device 7 in an axial direction of contact elements 8 so that the ends or front ends of contact elements 8 strike contact surfaces of substrate 2 on the one hand and contact surfaces 11 on the other, so that an electrical connection is created from substrate 2 to connection device 7. If contact elements 8 are preferably constructed as bent wires, these can extend laterally outward and thereby reliably ensure proper contacting of all contact points. To ensure that sufficient force is exerted on the contact elements without guide plate 9 being deformed by the load, the latter is allocated a support plate 17, as shown by an arrow in FIG. 1.

For guiding and holding contact elements 8, contact head 6 has two guide plates 13, 14 that are spaced apart and arranged parallel to each other. Guide plates 13, 14 are oriented to each other by a spacer 15.

Figure 2:
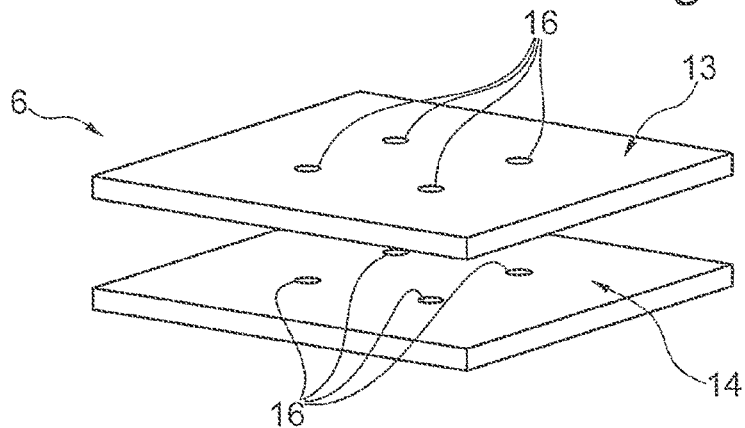
FIG. 2 shows guide plates of a contact head of the test device.

In regard to this, FIG. 2 depicts in a simplified perspective view the two guide plates 13, 14, which are arranged parallel to each other. Both guide plates 13, 14 each have a plurality of guide openings 16, which are constructed and arranged on guide plates 13, 14 in such a manner that in each case one contact element 8 passes through two guide openings 16, which are aligned with each other or offset, of both guide plates 13, 14, and is thereby guided by the guide plates and preferably held in a friction-locking manner. According to the embodiment shown in FIG. 2, only four guide openings 16 are depicted in each of the guide plates 13, 14; actually, guide plates 13, 14 have a large number of guide openings 16. One shall thereby see that for each guide opening 16 of guide plate 13, there is constructed a guide opening 16 aligned or corresponding with it in guide plate 14. The distance between guide plates 13, 14 is advantageously designed for the lateral buckling or outward extension of contact elements 8 when conducting the test as described earlier.

While guide plates 13, 14 are manufactured of ceramics, spacer 15 is manufactured out of steel. As a result, in the event of a temperature change, guide plates 13, 14 and spacer 15 can also behave differently due to their variable temperature expansion coefficients. In particular, guide plates 13, 14 can expand in a temperature-contingent manner in their respective plane, which results in contact elements 8, which are held in guide openings 16, being moved along with guide plates 13, 14. This in turn can result in contact elements 8 no longer striking contact surfaces 11 or the contact points of substrate 2, and thereby preventing the test from being reliably performed any more. It is therefore already known to provide a centering device 20, which forms a middle-centering for guide plates 13, 14.

Figure 3:
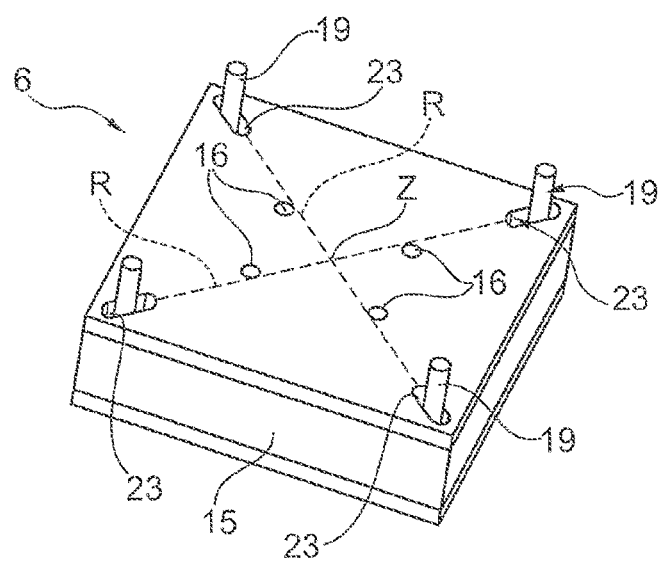
FIG. 3 shows the contact head according to a known embodiment.

FIG. 3 depicts such a centering device 20 by means of an embodiment illustrated in a foreshortened manner. Slots 23 are thereby constructed in the guide plates, which extend in their longitudinal direction radially toward center Z of respective guide plate 13, 14. Centering pins 19 attached in spacer 15 each project into one of the slots 23 and are constructed in such a manner that they are longitudinally displaceable in slots 23, in other words on a notional radial axis R in relation to center Z in respective slot 23. If temperature-contingent size-changes occur, guide plates 13, 14 can now radially expand or shrink in the plane, and specifically outward from center Z so that it is ensured that guide openings 16 are only minimally influenced in their position by a temperature-related expansion. Because this occurs extending from center Z, it is ensured that the longitudinal expansions are not cumulative over the entire width or length of respective guide plate 13, 14.

Figure 4:
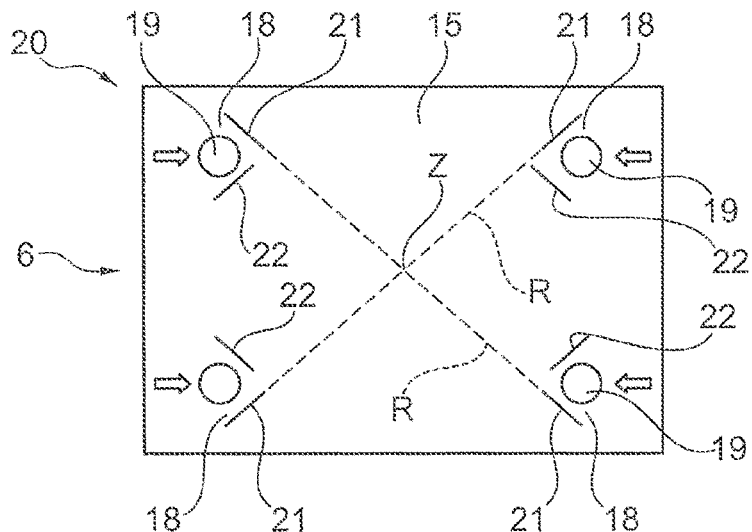
FIG. 4 shows an advantageous embodiment of the contact head in a schematic view and FIG. 5 shows a detail view of the advantageous embodiment.

FIG. 4 depicts contact head 6 with one of the advantageous centering devices 20. FIG. 4 also depicts centering device 20 in a schematic top view on to spacer 15. Multiple centering openings 18 are constructed in the spacer. According to the advantageous embodiment, it is provided that centering openings 18 each have a guide surface 21, which runs not only parallel but exactly along respective radial axis R. In each case, a supplementary guide surface 22 is formed perpendicular or alternatively at an acute angle to guide surface 21, so that guide surface 21 and supplementary guide surface 22 jointly form a triangular or prism-shaped centering contour.

Figure 5:
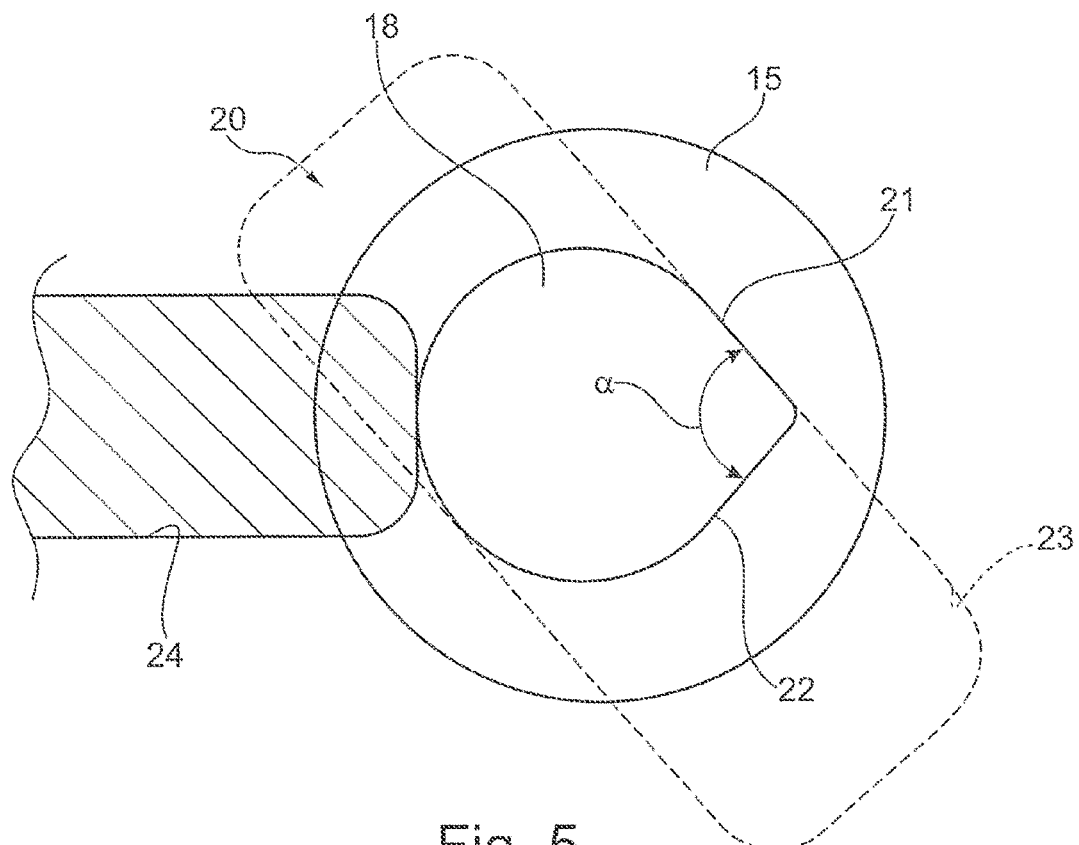

In regard to this, FIG. 5 depicts in a magnified view one of the centering openings 18, which is constructed in spacer 15 in FIG. 4 top left, of centering device 20 in a magnified detail view. One can thereby see guide surface 21 as well as supplementary guide surface 22, which form angle $\alpha=90°$ according to the present embodiment, wherein guide surface 21 lies on radial axis R to center Z. Guide surface 21 and supplementary guide surface 22 are constructed to have the same length according to the present embodiment and transition into a circular arc contour of centering opening 18, which has the contour of centering opening 18.

To produce centering opening 18, it is provided in particular that centering openings 18 are produced by eroding, particularly wire-eroding, guide surface 21 and supplementary surface 22 in spacer 15. Because only guide surface 21 is required to fulfill a function for centering and tolerance compensation, compliance with strict tolerances must be observed only for it. The remaining contour of centering opening 18 is less relevant because in a normal situation, none of the centering pins 19 abut the remaining contour of respective centering openings 18. Because centering openings 18 do not have any parallel guide surfaces and thus always have a clearance and a dimension for the expansion, the opposite side of respective guide surface 21 is irrelevant for guiding centering pin 19, so that correspondingly large tolerances can be taken into consideration during production. FIG. 5 also shows by means of a dotted line the orientation of slot 23 assigned to centering opening 18.

According to the preceding embodiment, exactly four such centering openings 18 are provided, wherein in each case two of the centering openings 18 are constructed diametrically opposite each other in relation to center Z in spacer 15 and contact head 6 respectively. Because guide surfaces run along radial axis R, the tolerances are not cumulative, with the consequence that the manufacturing tolerances of centering pins 19 can turn out to be larger than before. The arrangement and construction of supplementary guide surfaces 22 must be less exact than before; also, an exact right angle is not required between supplementary guide surfaces 22 and the respectively assigned guide surfaces 21. Instead, there may be angle α that deviates from the right angle. The size of respective centering opening 18 must only be larger overall than the diameter of respective centering pin 19 to allow the installation of respective centering pin 19.

In regard to the installation, centering pins 19 are attached to spacer 15, particularly by means of lateral setscrews 24, particularly by means of grub screws, in such a manner that they are impinged by an attachment force toward the center, as shown in FIG. 4 by arrows and in FIG. 5 by dashed lines. As a result, centering pins 19 are each pressed against respective guide surface 21 so that an orientation is assured in a simple manner during installation.

If thermal stresses or temperature-contingent changes in length were to occur in one of the guide plates 13, 14, guide plates 13, 14 can also already expand radially as before, without guide openings 16 and thus contact elements 8 deviating too far from a predetermined position. The orientation of guide openings 16 to each other is also thereby maintained in such a manner that a sufficient retention force is ensured for holding contact elements 8, particularly in a friction-locking manner.

What is claimed is:

1. A contact head for an electrical test device for electrically testing substrates, the contact head comprising:
    at least a first guide plate and a second guide plate arranged relative to each other by a spacer, the first guide plate including a first plurality of guide openings, the second guide plate including a second plurality of guide openings essentially aligned with the first plurality of guide openings;
    a plurality of pin-shaped contact elements each received by a first corresponding guide opening of the first plurality of guide openings and a second corresponding guide opening of the second plurality of guide openings; and
    a centering device for orienting the first and second guide plates relative to one another, the centering device defining four slots and including four centering pins, each of the four slots extending toward a center of the contact head, in at least of one of the guide plates, and receiving a corresponding centering pin of the four centering pins, each of the four centering pins held in a corresponding centering opening of the spacer, the centering openings each having only one guide surface oriented at least essentially parallel to a radial axis of the center of the contact head.

2. The contact head according to claim 1, wherein the guide surfaces each run along the radial axis.

3. The contact head according to claim 1, wherein the centering openings each have one supplementary guide surface oriented at least essentially perpendicular to the guide surface.

4. The contact head according to claim 3, wherein each supplementary guide surface is a radially inward end of a respective guide surface.

5. The contact head according to claim 1, wherein the centering openings are constructed in a square, rectangular, triangular, or, except for the guide surface and supplementary guide surface, circular manner.

6. The contact head according to claim 1, wherein two of the centering openings are arranged diametrically opposite each other in relation to the center.

7. The contact head according to claim 1, wherein the centering pins are displaceably positioned in slots of both of the first and second guide plates.

8. The contact head according to claim 1, wherein the centering pins are attached by radial set screws in the centering openings.

9. The contact head according to claim 1, wherein the guide plates are produced of a ceramic material and the spacer is produced of a metal.

10. The contact head according to claim 1 in combination with the electrical test device for electrically testing substrates.

* * * * *